June 2, 1970 H. F. RUEFFER ETAL 3,514,848

METHOD OF MAKING A SEMICONDUCTOR DEVICE WITH PROTECTIVE GLASS SEALING

Filed March 14, 1966 4 Sheets-Sheet 1

INVENTORS.
RICHARD J. BELARDI,
HAROLD F. RUEFFER,
BY Paul M. Coble
ATTORNEY.

June 2, 1970 H. F. RUEFFER ET AL 3,514,848

METHOD OF MAKING A SEMICONDUCTOR DEVICE WITH PROTECTIVE GLASS SEALING

Filed March 14, 1966

4 Sheets-Sheet 2

METHOD OF MAKING A SEMICONDUCTOR DEVICE WITH PROTECTIVE GLASS SEALING

Filed March 14, 1966

June 2, 1970 H. F. RUEFFER ET AL 3,514,848

METHOD OF MAKING A SEMICONDUCTOR DEVICE WITH PROTECTIVE GLASS SEALING

Filed March 14, 1966 4 Sheets-Sheet 4

United States Patent Office 3,514,848
Patented June 2, 1970

3,514,848
METHOD OF MAKING A SEMICONDUCTOR DEVICE WITH PROTECTIVE GLASS SEALING

Harold F. Rueffer, Costa Mesa, and Richard J. Belardi, Anaheim, Calif., assignors to Hughes Aircraft Company, Culver City, Calif.

Filed Mar. 14, 1966, Ser. No. 534,135
Int. Cl. H01l *1/10*; B01j *17/00*; C03c *27/02*
U.S. Cl. 29—588 6 Claims

ABSTRACT OF THE DISCLOSURE

A method for providing a hermetic seal for a surface of a electrical device portion of a body of semiconductor material. An oxide layer is disposed over a portion of the semiconductor surface; the oxide layer defining an aperture exposing a portion of the surface laterally externally of and surrounding the surface intersection of an outermost p-n junction. A layer of glass is disposed over the oxide layer and over that portion of the semiconductor sufrace beneath the aperture. The glass is sealed to the semiconductor surface either directly or through a ring-like metal element disposed in the aperture.

This invention relates to semiconductor devices such as transistors and diodes, and more particularly relates to a glass protected semiconductor device having an improved seal between the protective covering and the semiconductor material. The invention also relates to a method for fabricating such a device.

In order to protect semiconductor devices from atmospheric contamination, it has been the practice to cover the semiconductor surface to be protected with a layer of insulating material such as an oxide of the semiconductor material. It has been found, however, that such an arrangement does not afford complete protection from moisture, and in order to provide additional protection the oxide layer is often covered with a layer of glass.

During semiconductor device manufacture, after first fabricating a large number of such devices in a single wafer of semiconductor material and covering the wafer with aforementioned oxide and glass layers, the wafer is diced into the individual semiconductor structures. The dicing operation entails making a cut through the oxide layer, and thus the semiconductor surfaces become exposed to moisture through the diced sides of the oxide layer in spite of the glass covering on top.

Accordingly, it is an object of the present invention to provide a protective arrangement for semiconductor surfaces which achieves greater protection from atmospheric contamination, and in particular from moisture, than has heretofere been provided.

It is a further object of the present invention to provide a glass protected semiconductor device having an improved seal between the protective covering and the semiconductor material.

It is a still further object of the present invention to provide a method for making semiconductor sealing arrangements having the advantageous features set forth above.

It is still another object of the present invention to provide a method for fabricating a plurality of sealed semiconductor devices from a single wafer of semiconductor material in which there is a reduced tendency toward edge chipping or breaking when dicing the wafer into the individual semiconductor units.

In accordance with the foregoing objects, a semiconductor device according to the present invention includes a body of semiconductor material having at least two regions of differing conductivity types formed therein, the regions being separated by a junction extending to a surface of the semiconductor body. A layer of an oxide of the semiconductor material is disposed over a substantial portion of the semiconductor surface. The oxide layer defines a ring-like aperture surrounding the intersection of the junction and the semiconductor surface. A layer of glass is disposed over the oxide layer and the portion of the semiconductor surface beneath the aperture. The glass layer is sealed to the aforesaid portion of the semiconductor surface either directly or through a ring-like metal element disposed in the aperture between the glass layer and the semiconductor surface. Electrically conductive means extends through the glass and the oxide layers to make electrical contact with at least one of the semiconductor regions.

In fabricating such a semiconductor device in accordance with the method of the invention, after first forming the aforementioned semiconductor regions and covering the semiconductor surface with the oxide layer, a ring-like portion of the oxide layer encompassing the oxide material covering the junction is removed to a depth sufficient to expose the adjacent portion of the surface of the semiconductor body. The layer of glass is then deposited over the oxide layer and the exposed portion of the semiconductor surface, after which the resulting structure is cut externally of at least a portion of the aforesaid portion of the semiconductor surface along directions perpendicular to the plane of the oxide layer. If the intermediate metal element is to be employed, metallic material is disposed over the exposed portion of the semiconductor surface prior to the glass deposition step.

Other and further objects, advantages and characteristic features of the present invention will become readily apparent fro mthe following detailed description of preferred embodiments of the invention when considered in conjunction with the accompanying drawings in which.

Before proceeding with the description, it should be noted that the structures illustrated in the respective figures represent small segments of the semiconductor wafer from which individual transistors are formed, and that the wafer actually contains a large plurality of such structures, the wafer being cut into segments to form the individual transistors during the final step in the fabrication process described herein.

Figure 1:
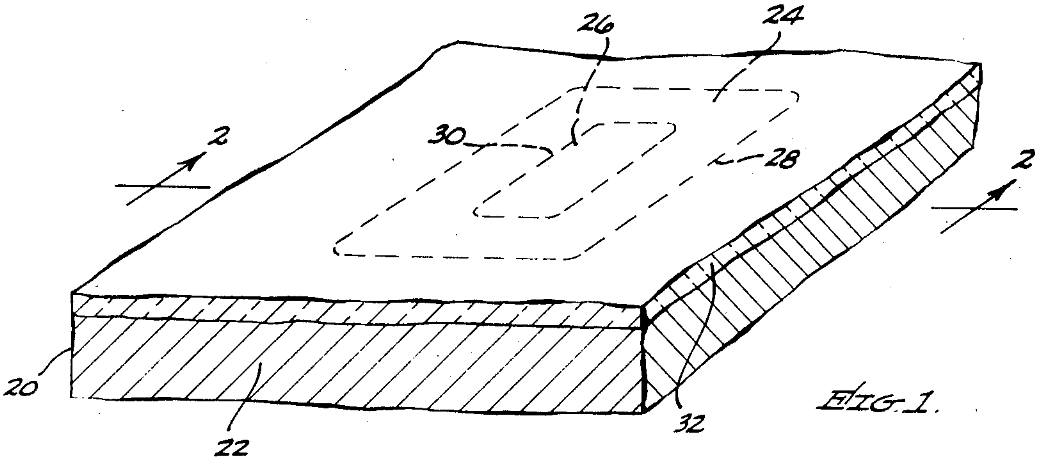
FIG. 1 is a perspective view, partly in section, of a portion of a semiconductor wafer in which transistor regions have been formed.
Figure 2:
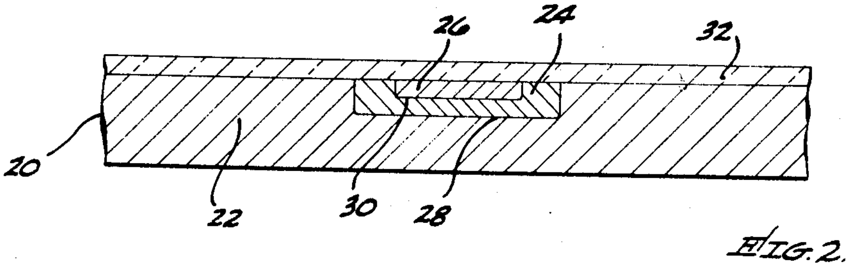
FIG. 2 is a sectional view taken along line 2—2 of FIG. 1.

Referring now with greater particularity to FIGS. 1 and 2, a plurality of transistor regions are shown as having been formed in a monocrystalline wafer 20 of semiconductor material, such as silicon, which contains a sufficient concentration of impurities to initially possess a uniform conductivity type of either n-type or p-type. Among these transistor regions are a collector region 22 which extends throughout most of the wafer portion shown, a base region 24 which has been diffused into the collector region, and an emitter region 26 which in turn has been diffused into the base region 24. The base region 24 is formed from a material having a conductivity type different from that of the collector region 22, while the emitter region 26 is formed from a different conductivity type material than that of the base region 24. By way of example, if the semiconductor wafer 20 (hence the collector region 22) is n-type, then the base region 24 would be p-type and the emitter region 26 would be n-type. Thus, a rectifying collector-base junction 28 is formed between the collector region 22 and the base region 24, and a rectifying base-emitter junction 30 exists between the base and emitter regions 24 and 26, respectively. The junctions 28 and 30 extend to the same surface of the semiconductor body 20, and on which surface there has been formed a layer 32 of insulating material. The layer 32 may consist of an oxide of the material constituting the body 20, for example, silicon dioxide. The formation of the oxide layer 32 and the diffused transistor regions 24 and 26 may be carried out by means of oxide-masking and diffusion techniques well known in the art and amply described in U.S. Pats. 3,025,589 to Hoerni and 3,212,162 to Moore.

Figure 3:
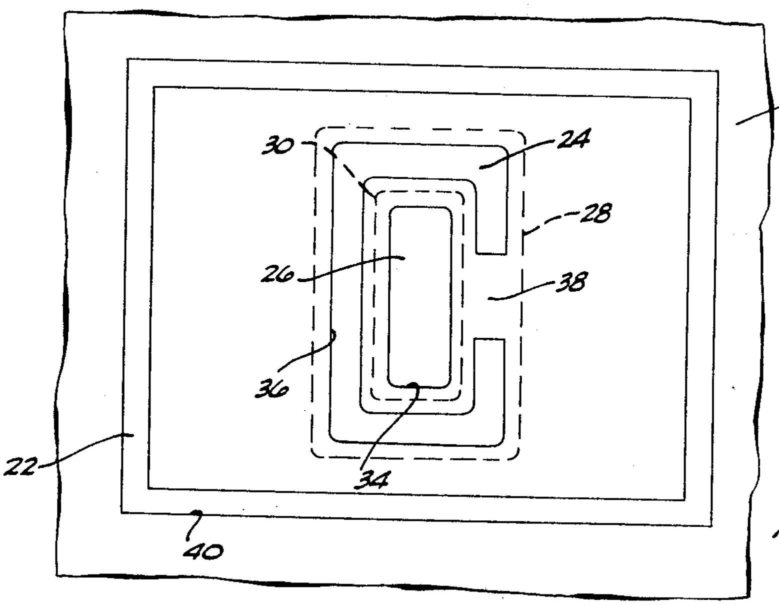
FIG. 3 is a plan view of the semiconductor wafer portion shown in FIGS. 1 and 2 at a later stage in the processing thereof in accordance with the invention.

In order to provide electrical contact with the base and emitter regions (and possibly with the collector region also), as well as to establish a peripheral sealing region for the transistor being fabricated, it is necessary to form openings of desired patterns through the oxide layer 32, for example, by means of well known photoengraving procedures such as those described on pages 151–162 of Transistor Technology, vol. III, by F. J. Biondi, D. Van Nostrand Co., Inc., Princeton, N.J., 1958. As is shown in FIG. 3, these openings include a central aperture 34 exposing a portion of the surface of the emitter region 26, a substantially C-shaped trench-like opening 36 exposing a surface portion of the base region 24 but leaving a bridge portion 38 in the oxide coating over which an emitter contact lead is subsequently deposited and a trench-like aperture 40 surrounding the openings 34 and 36 in ring-like fashion and exposing a portion of the surface of the collector region 22.

Figure 4:
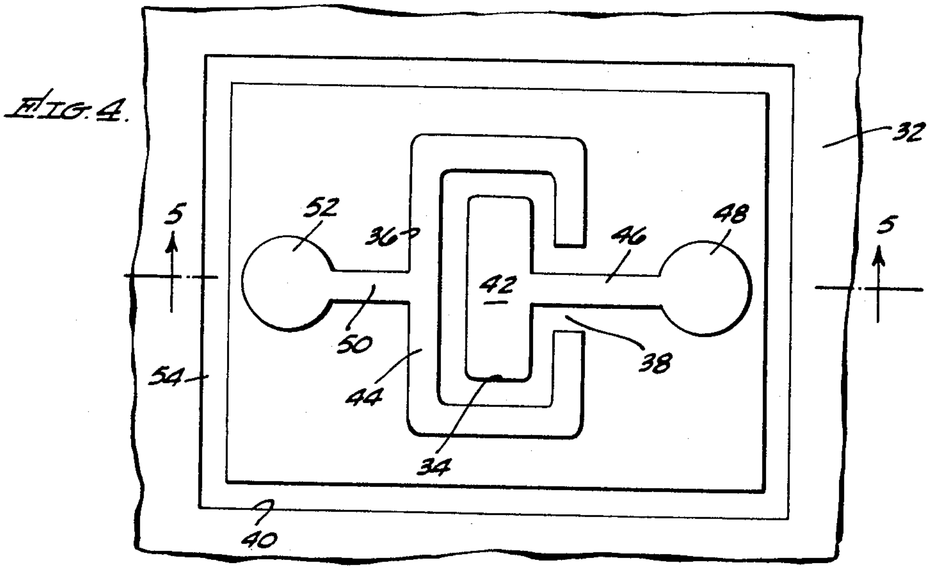
FIG. 4 is a plan view of the semiconductor wafer portion shown in FIG. 3 at a still later stage in the processing thereof according to the invention.
Figure 5:
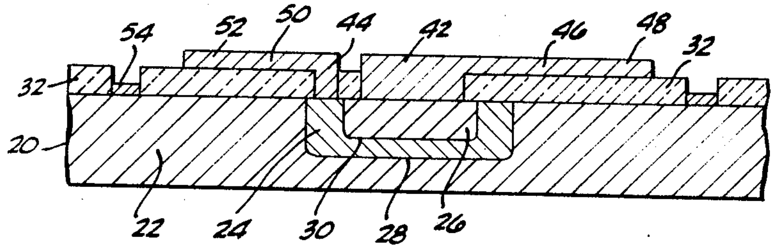
FIG. 5 is a sectional view taken along line 5—5 of FIG. 4.

A layer of metal, such as silver, gold, chromium, aluminum, or cadmium, or a combination of two or more of these metals, for example, is then vacuum-deposited over the oxide layer 32 and the exposed portions of the surface of the semiconductor body 20 to a thickness of about 6,000 A., for example. Since it is difficult to attach circuit leads directly to the relatively small base and emitter surface areas, an interconnect and contact pattern is then formed in the vacuum-deposited metal layer, for example, by using well known photoengraving techniques to remove all of the deposited metal layer except where it is desired to form the interconnect and contact pattern and the peripheral protective sealing element. As is illustrated in FIGS. 4 and 5, the interconnect and contact pattern includes an emitter contact 42 formed in the oxide opening 34 and a base contact 44 formed in the trench 36. The base contact 42 has a strip portion 46 extending outwardly over the bridge portion 38 of the oxide layer 32 and terminating in an enlarged contact pad area 48. Similarly, the base contact 44 has a strip portion 50 extending outwardly in the opposite direction and terminating in an enlarged contact pad area 52. Also, the deposited metal is retained in the trench 40 so as to leave a metal ring-like element 54 in contact with the semiconductor body 20 and surrounding the oxide material covering the regions where the junctions 28 and 30 extend to the semiconductor surface. The emitter contact 42, the base contact 44, and the ring-like element 54 are then bonded to the emitter region 26, the base region 24, and the collector region 22, respectively, by heating the structure to a temperature of around 500° C.

Figure 6:
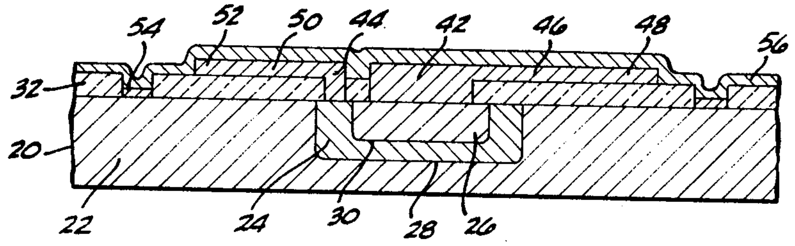
FIGS. 6 through 10 are sectional views, similar to FIG. 5, of the semiconductor wafer portion shown therein illustrating further successive steps in the processing of the wafer portion in accordance with the invention.

As is shown in FIG. 6, a metal layer 56 is then vacuum-deposited over the oxide layer 32 and the metal patterns previously formed on and through the layer 32. The metal layer 56 may be of silver and may be deposited to a thickness of 5000 A., for example.

Figure 7:
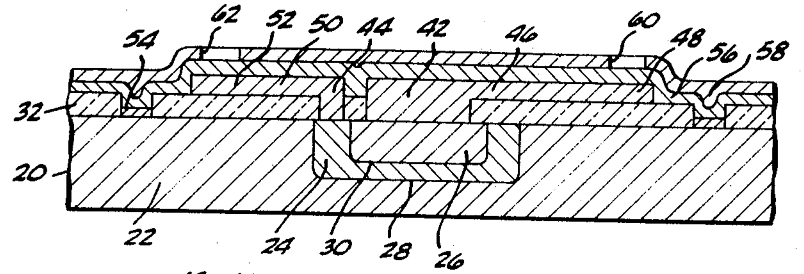
Figure 8:
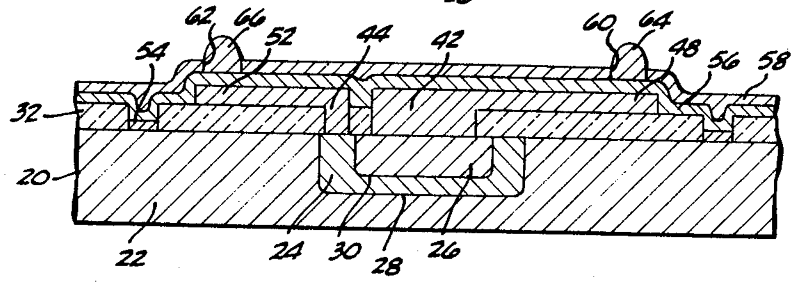

As may be seen from FIG. 7, a layer 58 of photoresist material is then formed over the metal layer 56, and by means of well known photoengraving techniques a pair of openings 60 and 62 may be formed in the layer 58 at locations above the central regions of the respective contact pads 48 and 52. The semiconductor body 20 is then immersed in an electroplating solution, utilizing the metal layer 56 as the cathode connection in the plating circuit, in order to deposit a metal such as silver onto the exposed surfaces of the metal layer 56. As a result of this electroplating operation, metal deposits in the form of bump-like members 64 and 66 (FIG. 8) are formed in the respective openings 60 and 62 in the photoresist layer 58, an exemplary total bump height being around 3 mils.

Figure 9:
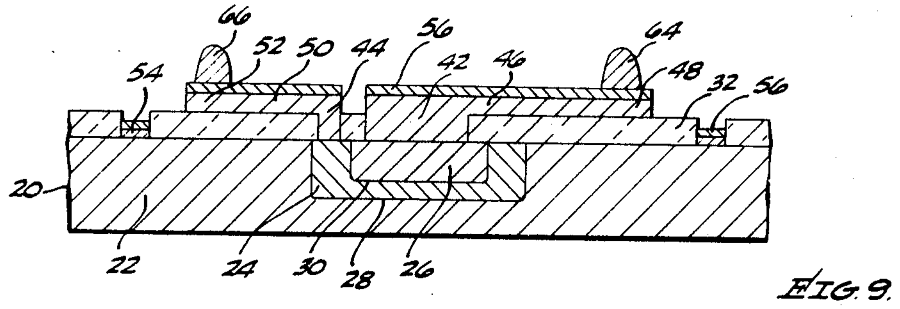

The photoresist film 58 and the portions of the metal electroplating layer 56 which are not in contact with other metallic material are then removed, by a simple etching technique or by a high velocity water spraying operation, for example, leaving the structure shown in FIG. 9. A layer 68 of glass is then deposited over the oxide coating 32 and the metal contact elements, for example, by *rf* sputtering or by pyrolytic deposition. Portions of the glass layer 68 covering the outer portions of the bumps 64 and 66 are removed by lapping or etching the glass so as to leave outwardly projecting emitter and base contact tabs to which external circuit leads can be connected, for example, by soldering.

Electrical connection to the collector region 22 may be afforded by plating a metal strip 69 onto the surface of the semiconductor body 20 opposite to the surface containing the oxide layer 32. Alternatively, connection to the collector region 22 could be made by forming an additional collector-exposing opening in the oxide layer 32 at the same time that the openings 34, 36 and 40 were made, depositing collector contact metal into this additional opening while the emitter and base contacts 42 and 44 are being deposited, and forming a bump-like member similar to the bumps 64 and 66 over the collector contact metal. Or, as a still further alternative, the ring-like element 54 could be provided with an extended pad portion similar to the emitter and base contact pads 48 and 52, and a bump-like connecting member could be formed on such a collector contact pad.

Figure 10:
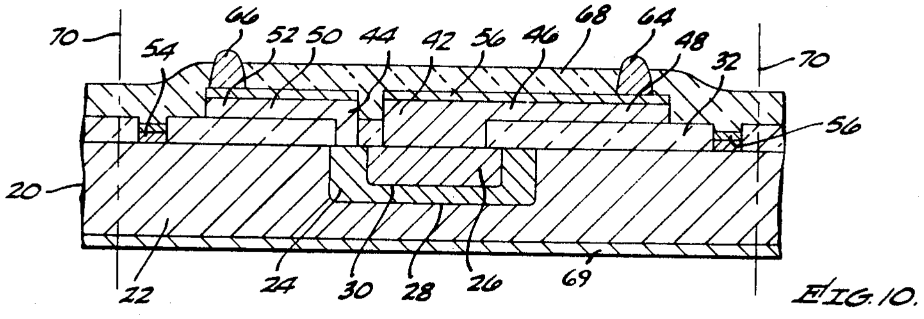
Figure 11:
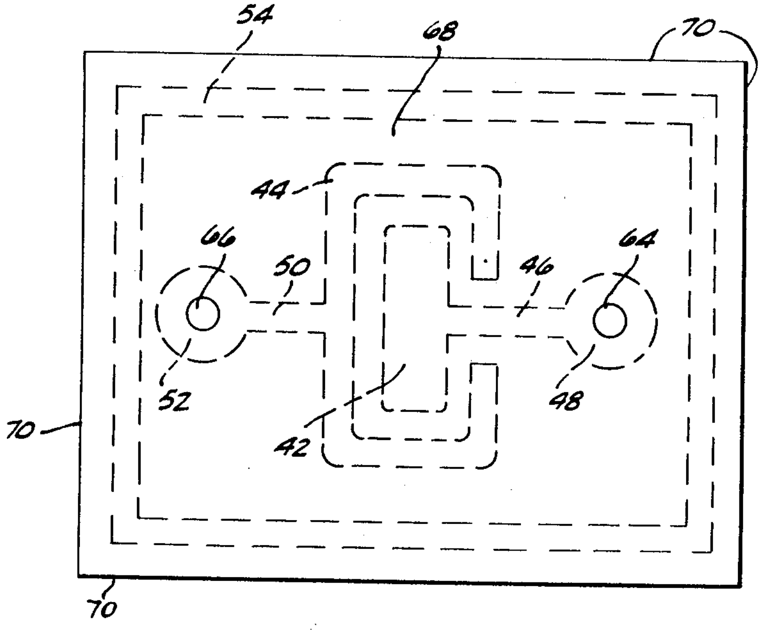
FIG. 11 is a plan view of a completed transistor device in accordance with one embodiment of the invention, and which device has been fabricated from the wafer portion shown in the preceding figures.

After reaching the steps of fabrication illustrated in FIG. 10, the semiconductor wafer 20 is diced, i.e., cut along the lines 70 into a plurality of individual transistors, one such transistor being illustrated in FIG. 11. The dicing cut is made externally of the metal ring-like element 54, and thus the glass layer 68, the metal element 54, and the bump-like members 64 and 66 together form a hermetic sealing arrangement with the semiconductor material, thereby affording the semiconductor junction regions greater protection from atmospheric contamination than has been achieved in the past.

Figure 12:
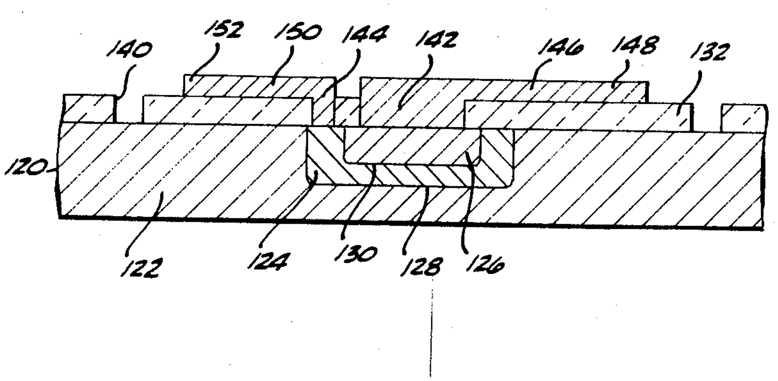
FIG. 12 is a sectional view of a transistor device in accordance with another embodiment of the present invention at the same stage in its fabrication as the device shown in FIG. 5.
Figure 13:
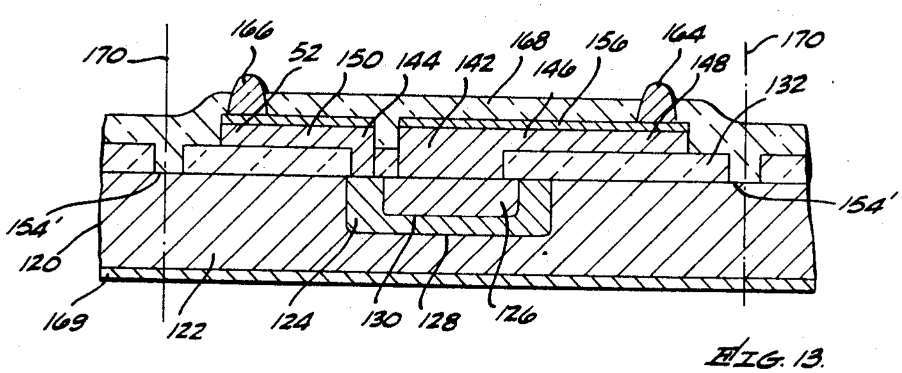
FIG. 13 is a sectional view of the transistor device illustrated in FIG. 12 at the same stage in its fabrication as the device shown in FIG. 10.

In accordance with another embodiment of the present invention, the metal ring-like element may be eliminated and the glass layer sealed directly to the semiconductor body. In this embodiment, which is illustrated in FIGS. 12 and 13, respective elements which are the same as those in the embodiment of FIGS. 1–11 are designated by the same reference numerals as their counterpart elements in the embodiment of FIGS. 1–11 except for the addition of the prefix numeral "1." As may be seen from FIG. 12, which depicts semiconductor wafer 120 at the same stage of processing as the semiconductor wafer 20 of FIG. 5, no metal is deposited in the trench 140 at the time when the emitter and base contacts 142 and 144, respectively, are being formed. Then, as may be seen from FIG. 13, when glass layer 168 is subsequently deposited (after the same intervening steps as those mentioned above with respect to FIGS. 6–9), portions of the glass will seal directly to the semiconductor wafer 120 along its surface region 154'.

In the embodiment of FIGS. 12 and 13, the semiconductor wafer 120 may be diced along lines 170 through the sealing region 154'. Moreover, when forming a direct glass-to-semiconductor seal in accordance with this embodiment, it is desirable to employe a glass which is essentially free from alkali ions and which has a thermal coefficient of expansion essentially the same as that of the semiconductor material. An example of a particular glass possessing these features is No. 1723 glass manufactured by Corning Glass Works, Sunnyvale, Calif.

It should be understood that while the foregoing discussion makes specific reference to the fabrication of transistor devices, the principles of the present invention are also applicable to the fabrication of diodes and monolithic circuits. Thus, although the invention has been shown and described with respect to particular embodiments, nevertheless, various changes and modifications obvious to a person skilled in the art to which the invention pertains are deemed to lie within the spirit and scope of the invention as set forth in the appended claims.

What is claimed is:

1. A method for providing a hermetic seal for a surface of an electrical device portion of a body of semiconductor material, said portion of said body having a plurality of regions of differing conductivity types, each pair of adjacent regions being separated by a p-n junction intersecting said surface in a manner encompassing the surface intersection of one of said pair of regions, said method comprising the steps of:

providing on said surface a layer of an oxide of said semiconductor material having an aperture exposing a first portion of said surface laterally externally of and surrounding the surface intersection of the outermost p-n junction of said electrical device portion and having an additional aperture exposing a selected portion of the surface of each said region surrounded by the surface intersection of said outermost p-n junction, providing an electrically conductive path to each said selected portion of said surface, depositing a layer of glass over said oxide layer and said first and each said selected portion of said surface and processing said glass layer to insure that an end of each said conductive path is exposed, and cutting the resultant structure externally of at least part of said first portion of said surface along directions perpendicular to the plane of said oxide layer to isolate said electrical device portion.

2. A method for providing a hermetic seal for a surface of an electrical device portion of a body of semiconductor material, said portion of said body having a plurality of regions of differing conductivity types, each pair of adjacent regions being separated by a p-n junction intersecting said surface in a manner encompassing the surface intersection of one of said pair of regions, said method comprising the steps of:

providing on said surface a layer of an oxide of said semiconductor material having an aperture exposing a first portion of said surface laterally externally of and surrounding the surface intersection of the outermost p-n junction of said electrical device portion and having an additional aperture exposing a selected portion of the surface of each said region surrounded by the surface intersection of said outermost p-n junction, providing an electrically conductive path to each said selected portion of said surface, depositing a layer of glass over said oxide layer and each said selected portion of said surface and directly over and in contact with said first portion of said surface and processing said glass layer to insure that an end of each said conductive path is exposed, and cutting the resultant structure externally of at least part of said first portion of said surface along directions perpendicular to the plane of said oxide layer to isolate said electrical device portion.

3. A method for providing a hermetic seal for a surface of an electrical device portion of a body of semiconductor material, said portion of said body having a plurality of regions of differing conductivity types, each pair of adjacent regions being separated by a p-n junction intersecting said surface in a manner encompassing the surface intersection of one of said pair of regions, said method comprising the steps of:

providing on said surface a layer of an oxide of said semiconductor material having an aperture exposing a first portion of said surface laterally externally of and surrounding the surface intersection of the outermost p-n junction of said electrical device portion and having an additional aperture exposing a selected portion of the surface of each said region surrounded by the surface intersection of said outermost p-n junction, depositing metallic material over and in contact with said first portion and each said selected portion of said surface, providing an electrically conductive path to the metallic material over each said selected portion of said surface, depositing a layer of glass over said oxide layer and said metallic material and processing said glass layer to insure that an end of each said conductive path is exposed, and cutting the resultant structure externally of at least part of said first portion of said surface along directions perpendicular to the plane of said oxide layer to isolate said electrical device portion.

4. A method for providing a hermetic seal for a surface of an electrical device portion of a body of semiconductor material, said portion of said body having a plurality of regions of differing conductivity types, each pair of adjacent regions being separated by a p-n junction intersecting said surface in a manner encompassing the surface intersection of one of said pair of regions, said surface being covered with a layer of an oxide of said semiconductor material, said method comprising the steps of:

removing portions of said oxide layer including a ring-like portion directly over a first portion of said surface laterally externally of and surrounding the surface intersection of the outermost p-n junction of said electrical device portion and an additional portion directly over a selected portion of the surface of each said region surrounded by the surface intersection of said outermost p-n junction to expose said first portion and each said selected portion of said surface.

providing an electrically conductive path to each said selected portion of said surface, depositing a layer of glass over said oxide layer and said first and each said selected portion of said surface and processing said glass layer to insure that an end of each said conductive path is exposed, and cutting the resultant structure externally of at least part of said first portion of said surface along directions perpendicular to the plane of said oxide layer to isolate said electrical device portion.

5. A method for providing a hermetic seal for a surface of an electrical device portion of a body of semiconductor material, said portion of said body having a plurality of regions of differing conductivity types, each pair of adjacent regions being separated by a p-n junction intersecting said surface in a manner encompassing the surface intersection of one of said pair of regions, said surface being covered with a layer of an oxide of said semiconductor material, said method comprising the steps of:

removing portions of said oxide layer including a ring-like portion directly over a first portion of said surface laterally externally of and surrounding the surface intersection of the outermost p-n junction of said electrical device portion and an additional portion directly over a selected portion of the surface of each said region surrounded by the surface intersection of said outermost p-n junction to expose said first portion and each said selected portion of said surface, providing an electrically conductive path to each said selected portion of said surface, depositing a layer of glass over said oxide layer and each said selected portion of said surface and directly over and in contact with said first portion of said surface and processing said glass layer to insure that an end of each said conductive path is exposed, and cutting the resultant structure externally of at least part of said first portion of said surface along directions perpendicular to the plane of said oxide layer to isolate said electrical device portion.

6. A method for providing a hermetic seal for a surface of an electrical device portion of a body of semiconductor material, said portion of said body having a plurality of regions of differing conductivity types, each pair of adjacent regions being separated by a p-n junction intersecting said surface in a manner encompassing the surface intersection of one of said pair of regions, said surface being covered with a layer of an oxide of said semiconductor material, said method comprising the steps of:

removing portions of said oxide layer including a ring-like portion directly over a first portion of said surface laterally externally of and surrounding the surface intersection of the outermost p-n junction of said electrical device portion and an additional portion directly over a selected portion of the surface of each said region surrounded by the surface intersection of said outermost p-n junction to expose said first portion and each said selected portion of said surface, depositing metallic material over and in contact with said first portion and each said selected portion of said surface, providing an electrically conductive path to the metallic material over each said selected portion of said surface, depositing a layer of glass over said oxide layer and said metallic material and processing said glass layer to insure that an end of each said conductive path is exposed, and cutting the resultant structure externally of at least part of said first portion of said surface along directions perpendicular to the plane of said oxide layer to isolate said electrical device portion.

References Cited

UNITED STATES PATENTS

| | | | |
|---|---|---|---|
| 3,369,290 | 2/1968 | Mayer et al. | 29—581 |
| 3,361,592 | 1/1968 | Quetsch et al. | 117—212 |
| 3,368,024 | 2/1968 | Bishop | 174—52 |
| 3,331,994 | 7/1967 | Kile | 317—234 |
| 3,323,956 | 6/1967 | Gee | 148—177 |
| 3,307,079 | 2/1967 | Eisenhower et al. | 317—101 |
| 3,303,399 | 2/1967 | Hoogendoorn et al. | 317—234 |
| 3,271,124 | 9/1966 | Clark | 65—54 |
| 3,261,075 | 7/1966 | Carman | 29—25.3 |
| 3,247,428 | 4/1966 | Perri et al. | 317—234 |
| 3,226,612 | 12/1965 | Haenichen | 317—234 |
| 3,197,681 | 7/1965 | Broussard | 317—235 |
| 3,319,311 | 5/1967 | Mutter | 317—235 X |
| 3,408,542 | 10/1968 | Dautzenberg et al. | 317—235 |

S. LEON BASHORE, Primary Examiner

S. R. FRIEDMAN, Assistant Examiner

U.S. Cl. X.R.

65—36, 59; 317—234, 235